United States Patent [19]
Hisamoto et al.

[11] Patent Number: 5,355,330
[45] Date of Patent: Oct. 11, 1994

[54] CAPACITIVE MEMORY HAVING A PN JUNCTION WRITING AND TUNNELING THROUGH AN INSULATOR OF A CHARGE HOLDING ELECTRODE

[75] Inventors: Dai Hisamoto, Kokubunji; Shoji Shukuri, Koganei; Kazuhiko Sagara, Hachiouji; Shinichiro Kimura, Kunitachi; Shinichi Minami, Kodaira; Eiji Takeda, Koganei, all of Japan

[73] Assignee: Hitachi, Ltd., Tokyo, Japan

[21] Appl. No.: 932,242

[22] Filed: Aug. 19, 1992

[30] Foreign Application Priority Data

Aug. 29, 1991 [JP] Japan .................. 3-218497

[51] Int. Cl.⁵ .............................. G11C 11/24
[52] U.S. Cl. .................... 365/149; 365/185; 257/68; 257/71; 257/296
[58] Field of Search ................ 257/66, 67, 68, 71, 257/214, 296, 298, 300, 316, 347, 350, 378; 365/149, 176, 177, 185

[56] References Cited

U.S. PATENT DOCUMENTS 4,161,039 7/1979 Rössler .................. 257/316
4,698,787 9/1987 Mukherjee et al. ............ 365/185
4,799,193 1/1989 Horiguchi et al. ............ 365/149

FOREIGN PATENT DOCUMENTS 0416574 9/1989 European Pat. Off. ........... 365/185

OTHER PUBLICATIONS

S. M. Sze; Physics of Semiconductor Devices, Second Edition, "Nonvolatile Memory Devices", pp. 496-505; 1985; John Wiley & Sons N.Y..

Primary Examiner—Eugene R. LaRoche
Assistant Examiner—F. Niranjan
Attorney, Agent, or Firm—Fay, Sharpe, Beall, Fagan, Minnich, & McKee

[57] ABSTRACT

A semiconductor memory device whose data hold condition is not affected due to degradation of transistor characteristics by minimizing leakage charges and the switching transistor size. The semiconductor memory device employs memory cell charge holding electrode that is insulated from the remaining memory cell structure, particularly the switching transistor source drain leakage path. The write element controls the tunneling of charge carriers through such insulator to the charge holding portion or capacitor electrode, for writing data. Particularly, the write element includes a PN junction for various advantages.

14 Claims, 19 Drawing Sheets

CAPACITIVE MEMORY HAVING A PN JUNCTION WRITING AND TUNNELING THROUGH AN INSULATOR OF A CHARGE HOLDING ELECTRODE

BACKGROUND OF THE INVENTION

The present invention relates to a semiconductor memory device of high integration density.

A conventional dynamic ram access memory (DRAM) has high integration density and has memory cells, each of which consists of a switching transistor and a capacitor. The physical structure of such a DRAM memory cell is shown in FIG. 2A, while FIG. 2B is a schematic diagram of the same. In each case, one bit of a memory cell is shown, which would be one memory cell of a memory matrix having a plurality of memory cells. The switching transistor is a MOSFET Q. The capacitor electrode CE stores data and is in the form of an impurity conductivity type opposed to that of the substrates and electrically separated by a PN junction between the electrode CE and the substrate semiconductor S. The capacitor electrode CE is electrically connected to the diffusion electrode layer of the switching transistor Q, the gate of which, G, is connected to word line 200 on the matrix. Therefore, the drain or source is formed by the capacitor electrode CE and the other of the source or drain is connected to the bit line 850 of the matrix. When the switching transistor is turned off, the capacitor electrode CE can store data because it is electrically separated from peripheral electrodes.

In the conventional structure of FIG. 2, the stored charge on the capacitor electrode CE is decreased as time elapses because of leakage through the junction with the substrate S and also because of the leakage current of the switching transistor Q. Therefore, the capacitor electrode CE cannot hold data permanently or statically. Thus, it is necessary to execute a "refresh" for rewriting data at frequent intervals. Because the refresh interval is determined by the stored charge amount, it is necessary to increase the stored charge amount in order to decrease the refresh frequency. However, because the stored charge amount of a capacitor is proportional to the area of the capacitor, there is a big problem that the stored charge amount decreases as the integration density of a memory cell increases, which increase in integration density decreases the capacitor size and correspondingly disadvantageously increases the frequency of refresh.

Moreover, when the size of the switching MOSFET is decreased, the leakage current flowing in the diffusion layer between source and drain usually increases, which is known as the short channel effect. Therefore, when integration density increases, the leakage current correspondingly increases to correspondingly increase the refresh frequency, because it is difficult to hold the off state due to such leakage causing the stored charge amount to decrease.

SUMMARY OF THE INVENTION

It is an object of the present invention to further analyze the problems with the prior art and to solve such problems.

More specifically, it is an object of the present invention to provide a semiconductor device and a circuit employing the same for memory whose data hold condition is less affected or not affected by degradation of transistor characteristics through increased integration density, which characteristics involve increased leakage current of the switching transistor, and which data hold condition is not affected by a reduction in the capacitor size due to increased integration density that in the prior art device would increase the refresh frequency. In both the prior art and the present invention, there is some leakage current from the charge holding capacitor to the substrate, but the present invention is not primarily directed to this problem.

As mentioned above, the prior art DRAM has the problem that the high integration of the memory cell means that the capacitor size is decreased, which correspondingly decreases the charge amount being held by the capacitor. With a smaller charge amount, the charge amount leaks off quicker, so that a higher integration density requires a higher refresh rate in the prior art. Further, with an increased integration density, the channel of the switching MOSFET becomes shorter, which will correspondingly increase the leakage current between source and drain, which leakage current being increased will again increase the rate at which the charge leaves the capacitor electrode to correspondingly increase the frequency of the refresh cycle. The present invention isolates the capacitor electrode from the source drain leakage, so that the charge holding capacity is not affected or little affected by the source drain leakage current and therefore little affected by increased integration density.

Therefore, it is an object of the present invention to provide a semiconductor memory device whose data hold condition is not affected due to degradation of transistor characteristics by minimizing leakage charges and the switching transistor size. More specifically, the semiconductor memory device of the present invention employs a memory cell charge holding electrode that is insulated from the remaining memory cell structure, particularly the switching transistor source drain leakage path. In addition to enclosing the charge holding electrode or portion with an insulator, a write down element includes the substrate contacting the insulator for changing the charge amount, particularly with such write down element advantageously employing a PN junction with different conductivity types.

In the present invention, the enclosure of the charge holding portion by an insulator prevents charge leakage. The write element controls the tunneling of charge carriers through such insulator to the charge holding portion or capacitor electrode, for writing data. Particularly, the write element includes a PN junction for various advantages

BRIEF DESCRIPTION OF THE DRAWING

Further objects, features, and advantages of the present invention will become more clear from the following detailed description of a preferred embodiment, as shown in the accompanying drawing, with modifications, wherein.

DETAILED DESCRIPTION OF THE PREFERRED EMBODIMENT

In the following description, like numerals will be used for like elements having like functions. Details of the present invention are shown with respect to a single memory cell, for conciseness of disclosure, although it is understood that the memory device is made up of a plurality of such memory cells, which for example may be arranged in a matrix as set forth in FIG. 25.

Memory operations will be described below with reference to FIGS. 3 through 7, in order to show that the structure of the present invention is effective to solve the abovementioned problems. With reference to the schematic electric diagram of FIG. 4, the memory cell of the present invention comprises a switching transistor A, a write element B, and a memory portion, particularly in the form of a capacitor electrode 600 that extends between the switching element A and the write element B for storing the charge corresponding to the data, which was written into the capacitor electrode by the write element B.

Figure 3:
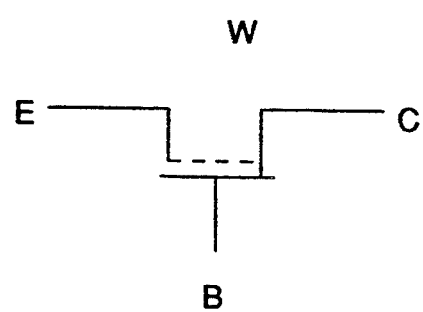
FIG. 3 is an electrical equivalent diagram showing the write down element of the present invention.
Figure 4:
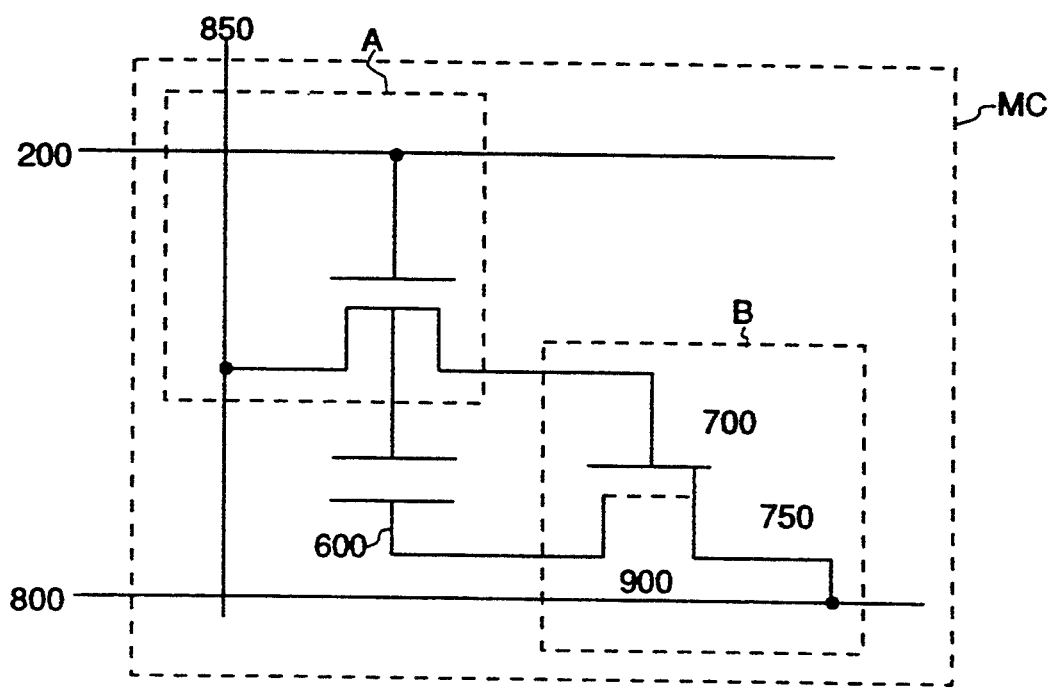
FIG. 4 is an electrical equivalent diagram showing the write down element and switching element of the present invention memory cell.

FIG. 3 is an electrical schematic equivalent diagram of the write element, which is one of the features of the present invention, which is element B in FIG. 4. In FIG. 3, there is shown a bipolar transistor comprising a collector C, base B and emitter E, wherein the emitter is also the memory portion 600 of FIG. 4.

Figure 25:
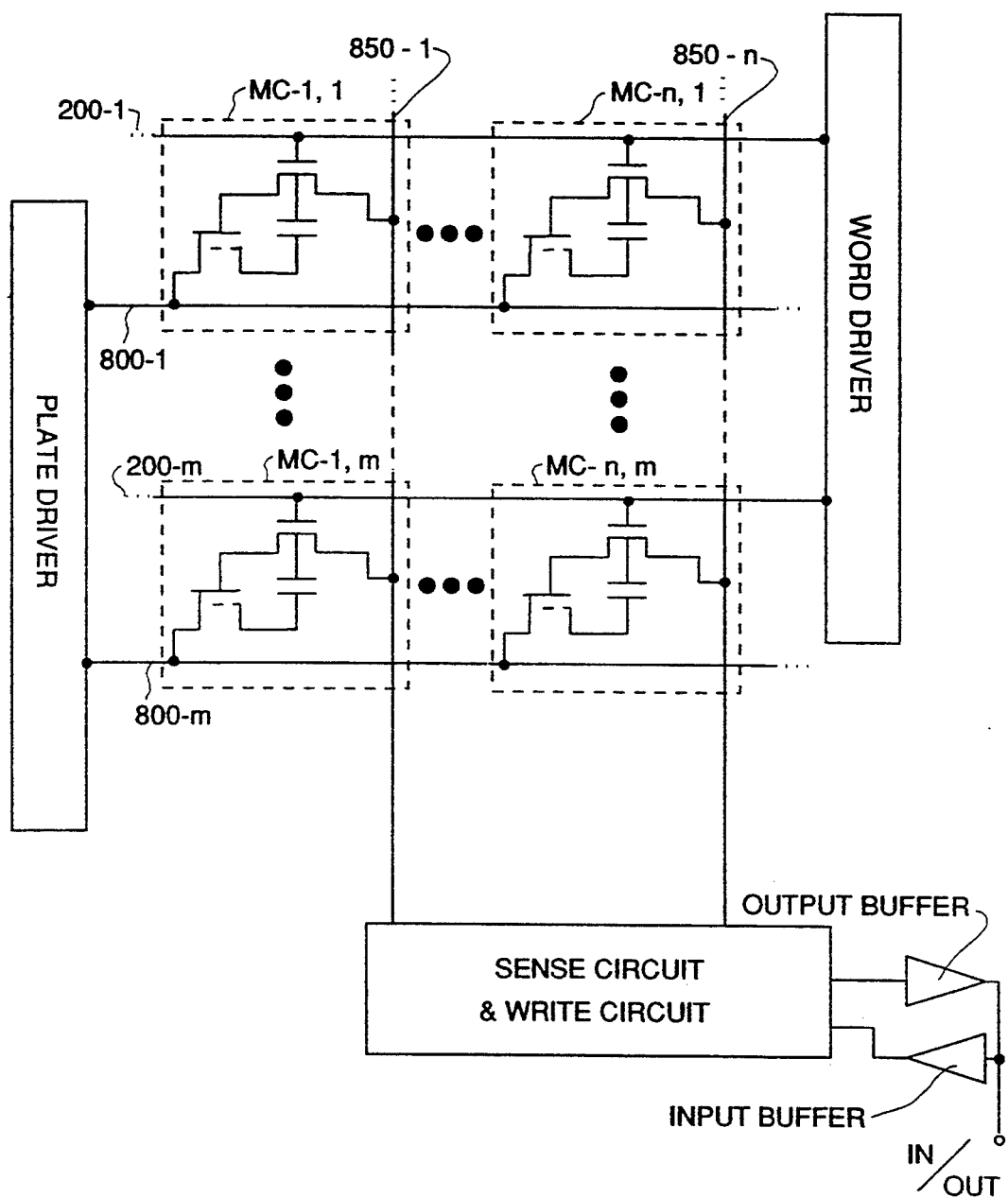
FIG. 25 shows a memory that includes a matrix of memory cells according to any embodiment or variation that is disclosed herein.
Figure 26:
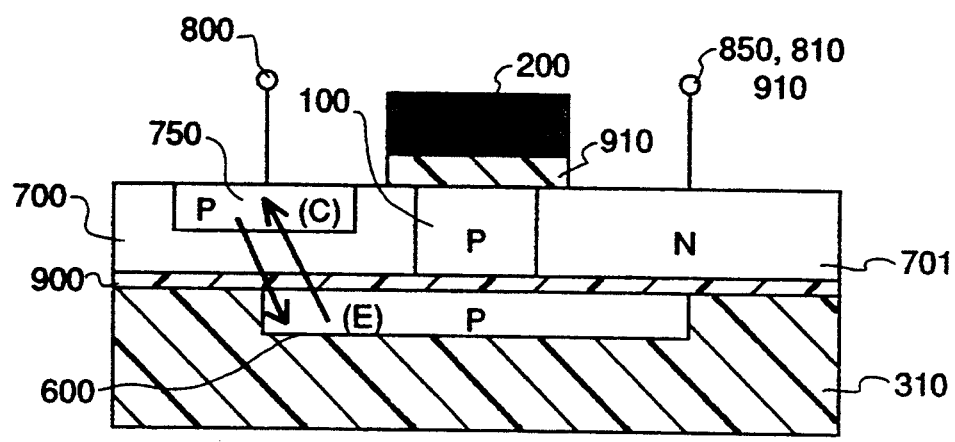
FIG. 26 is a schematic structural diagram of a cross section of the semiconductor device of FIG. 1.

With reference again to FIG. 4 and FIG. 25, it is seen that the memory cell of FIG. 4 is repeated throughout FIG. 25 in a matrix form, which memory cells M C-1, 1 to M C-n, m connected by bit lines 850-1 through 850-n, word lines 200-1 through 200-m, and plate lines 800-1 through 800-m, where n and m are integers, with n corresponding to the bit length of a word in the memory and m being an integer corresponding to the number of words that may be stored in the memory. Therefore, it is seen that there are a number of memory cells equal to m×n, with each memory cell being identical to the structure shown in FIG. 4 or any of the other embodiments herein. As shown in FIG. 25, there is a word driver for selectively driving the word lines 200-1 to 200-m, in a well known manner. Also in a conventional manner, there is a plate driver for driving the plate lines 800-1 through 800-m, a sense circuit and write circuit connected to the bit lines 850-1 through 850-n, input and output buffers, and an input output terminal for the memory. Each of the memory cells MC-1,1 through MC-n,m is identical to the memory cell shown in the first embodiment or any other embodiment set forth herein.

Figure 1:
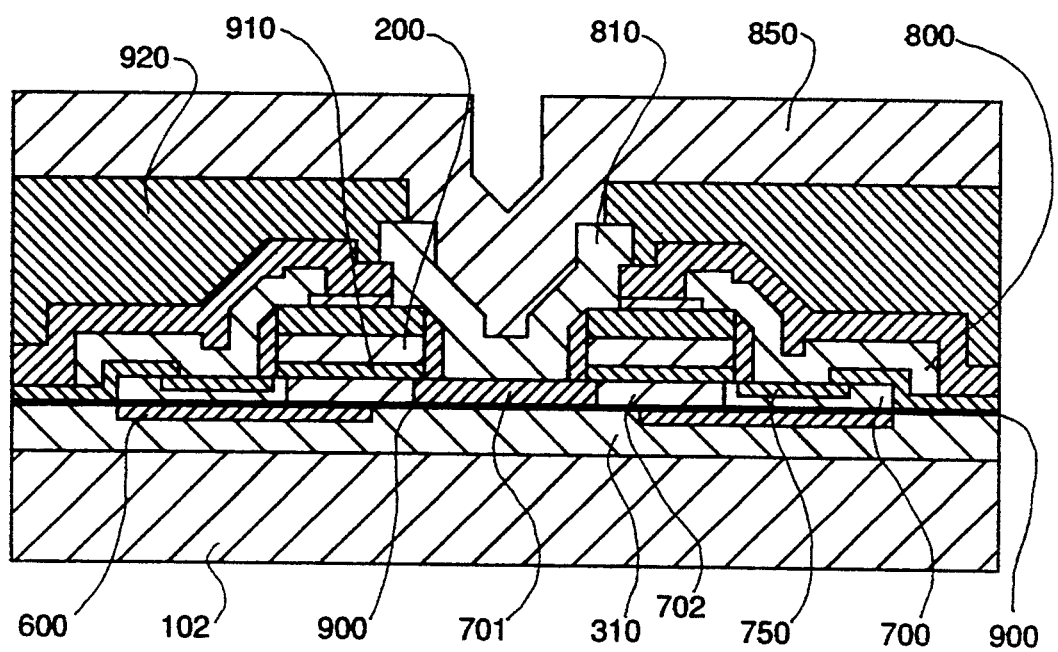
FIG. 1 is a sectional view of a first embodiment of the present invention.

In the embodiment of FIG. 1, the switching transistor A of FIG. 4 has the structure of a conventional MOSFET of SOI (silicon on insulator). The write element is preferably a bipolar transistor, according to the first embodiment, having a tunneling insulating film between the emitter and base electrodes. The emitter, also known as the memory portion or charge storage portion or electrode 600 is completely covered with an insulator. The details of FIG. 1 will be apparent after the description of FIGS. 8–19.

Figure 5:
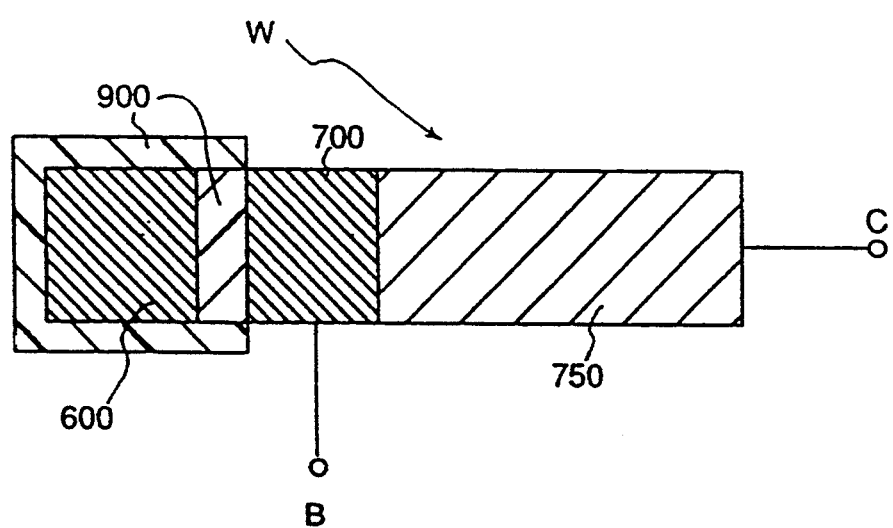
FIG. 5 is an equivalent structural diagram showing the memory cell of the present invention.

FIG. 5 is a simplified structure of the write element of FIG. 3. The charge storage portion 600 is completely surrounded, that is completely three-dimensionally enveloped by an insulating film 900. In FIG. 5, a bipolar transistor is formed with the emitter 600, a base 700, and a collector 750. The base, collector interface forms a PN junction, with the base 700 preferably being of N-type semiconductor conductivity and the collector electrode 750 being of P-type semiconductor material. With such an arrangement, the collector to base is biased to write as will be explained. The PN junction may also be formed when the base 700 is of P-type material and the collector 750 is of N-type material, but the following description of the function will be based upon the write element transistor having an N-type base and a P-type collector. It is only necessary that the emitter 600 be of some conducting material or the like to hold a charge. Therefore, for the transistor shown in FIG. 5, the emitter terminal is open. It is also contemplated that the function of the collector and emitter may be reversed.

Figure 6:
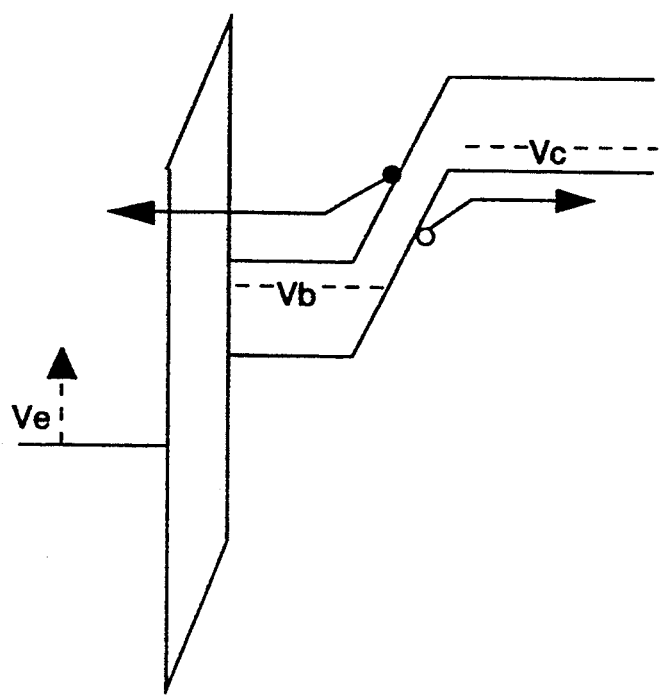
FIG. 6 is an energy band diagram showing the operational characteristics of the write cycle of the present invention.
Figure 7:
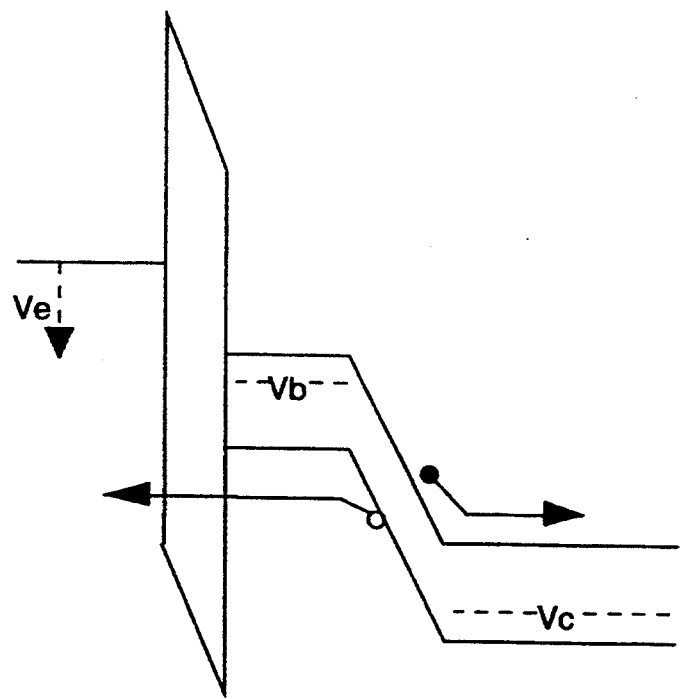
FIG. 7 is an energy band diagram showing the write operational characteristics of the present invention with carriers of opposite polarity from that employed with FIG. 6, which also could be considered an erase cycle for the write cycle shown in FIG. 6.

FIG. 6 is an energy band diagram for a reverse bias applied between the base 700 and collector 750 for performing the write operation by tunneling electrons through the tunneling insulation 900 between the base 700 and emitter 600. The energy band diagram is a diagram depicting the various energy levels within the atoms of the conductors, semiconductors and insulators of a device. In FIG. 6 and FIG. 7, dashed lines show the quasi-Fermi levels which correspond to the applied bias of each electrodes. Using the diagram of FIG. 6 for a write operation, the switching transistor A of FIG. 4 will be "ON", the potential $V_B$ of the base 700 will be fixed to that of the bit line 850 and the potential $V_C$ of the collector to base PN junction 750/700 will be reversed biased. Therefore, the PN junction of the base 700/collector 750 will accelerate electrons (solid circle), which will then tunnel through the tunneling insulation 900 between the base 700 and emitter 600, so that one or more electrons will enter the emitter 600 to decrease the potential of the memory charge storage portion 600, which according to conventional terminology for an energy band diagram is increasing the potential $V_E$ of the emitter as shown in FIG. 6. Some injection mechanisms through insulator films, such as direct tunneling injection and hot carrier injection, are known. Accordingly, we use a "tunnel" as a general term to show every mechanism. It is seen, from FIG. 6, that holes (white circles) produced at the junction will flow in the opposite direction.

The similar energy band diagram of FIG. 7 is with respect to the condition where the collector to base is forward biased, so that the holes tunneled through the insulation 900 as indicated to decrease the energy band potential of the emitter, or conventionally speaking to increase the potential $V_E$ of the emitter or memory charge storage portion 600. If FIG. 6 is considered a write operation, FIG. 7 is then an operation for erasing the memory, or conversely speaking FIG. 7 may be referred to as a write operation and FIG. 6 may be referred to as an erase operation.

As shown in FIGS. 6 and 7, it is possible to give high and low potential states to the memory charge storage portion 600 in accordance with the forward and reverse bias operation of the write down element W. Thus, the threshold voltage of the switching transistor A becomes $V_H$ when the memory charge storage portion 600 is at a high potential, and the threshold voltage of the switching transistor A becomes $V_L$ when the memory charge storage portion is at a low potential. Thereby, the write and erase cycles have been described.

Figure 2A:
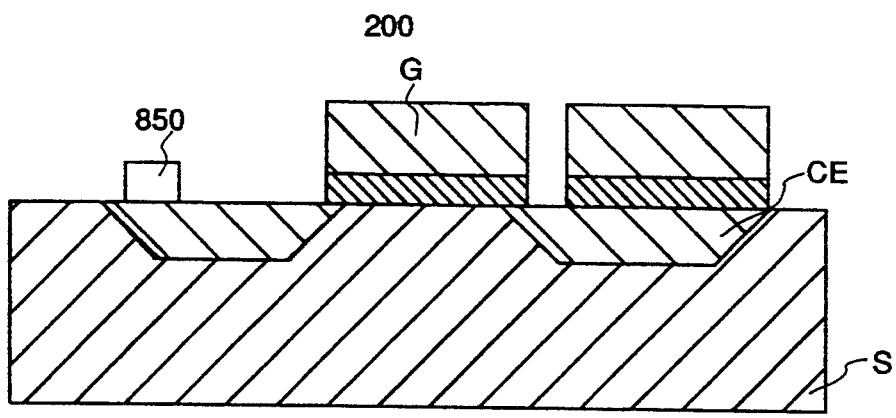
FIG. 2A is a schematic cross sectional view of a prior art memory device.
Figure 2B:
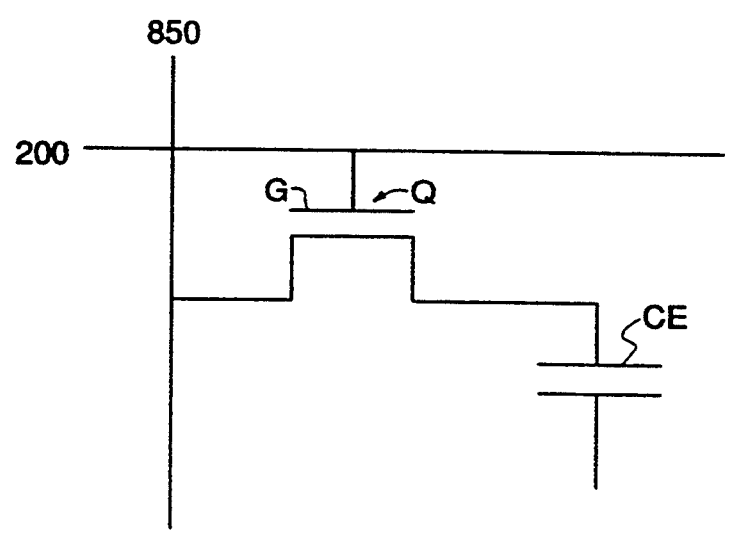
FIG. 2B is an electrical schematic of the prior art device of FIG. 2A.

For the conventional DRAM cell shown in FIG. 2, if the leakage current increases as the result of decrease in the size of the switching transistor, it is difficult to hold the potential state of the memory portion because the switching transistor directly supports the leakage of the accumulated charges of the capacitor storage area. For the structure of the present invention, however, leakage between the source and drain of the switching transistor A does not affect the memory charge storage portion 600 directly holding the data, because the charge storage portion 600 is completely surrounded or enveloped by an insulator and isolated from the source to drain leakage of the switching transistor A. Therefore, it is easy to decrease the size of the switching transistor and thereby increase the integration density of a memory, such as that of FIG. 25, when employing the features of the present invention.

For the memory cell of the present invention, the base electrode B for controlling the write element W is connected to the bit line 850 through the switching transistor A. The following is a description of the data hold condition, following the above-mentioned write. Data hold occurs with the switching transistor A in the "OFF" state. The write element W is also brought into an "OFF" state, because the base 700 is kept in equilibrium with the collector potential 750, that is there is no substantial bias between the collector 750 and base 700. Thereby, the charge on the memory charge storage portion 600 is maintained and is not leaked off, because the memory charge storage portion 600 is completely surrounded or enveloped by the insulator 900. Therefore, no refresh cycle is needed with the present invention or is needed only infrequently. Therefore, the present invention can be considered a nonvolatile memory or static memory.

In the write condition, when the switching transistor is in the ON state, the potential of the base 700 is fixed to the potential of the bit line 850. Therefore, the storing of a high or low charge by the write element B is executed in accordance with the potential of the bit line 850 to write the charged condition (tunneling electrons or tunneling holes) of the memory charge storage portion 600.

The read cycle will now be described with respect to the first embodiment. To select a particular memory cell, its word line 200 is raised to a medium voltage $V_M$, between the above-mentioned high and low voltages $V_H$ and $V_L$. Further, a bias voltage is applied between the plate line 800 (for example for both selected and non selected memory cells) and the bit line 850. If a current flows between the plate line 800 and the bit line 850, the threshold voltage of the switching transistor A is considered to be $V_L$, that is the low state for the memory cell. If no current flows between the plate line 800 and the bit line 850, the threshold voltage of the switching transistor A is $V_H$, that is the memory cell is at the high state. Thereby, the data, a high state or low state, can be read non-destructively by setting the bit line potential at data read with respect to the plate line potential, which data read is between $V_H$ and $V_L$ for forward bias. It is thus seen that the current consumption is minimized by bringing other bit lines under a reverse bias state with respect to the collector potential, that is non selected memory cells that do not have a common plate line will be reversed biased.

With the principle of the present invention thus described, the structure of the first embodiment will be described. FIG. 1 is a cross sectional view of the first embodiment, and FIGS. 8 through 19 are successive cross sectional views of the first embodiment at various construction stages, consecutively.

FIG. 1 shows two memory cells constructed on a substrate 102 for sharing the same bit line 850. The bit line 850 is connected to the electrode 701 formed by densely implanting an impurity in a semiconductor to make the semiconductor conductive through the bit line connecting layer 810. The switching transistor A is formed by the electrodes 700, 701 and the word line 200. The word line 200 is a gate electrode for controlling the current within the channel 702 running between electrodes 700 and 701, which electrodes 700 and 701 function as drain and source. The electrode 700 faces the charge storage portion electrode 600 through the tunneling portion of the insulating film 900 formed under the electrode 700. The charge storage electrode portion 600 is completely enclosed by insulating films 900 and 310, so that the electrode 600 is not electrically connected with any other electrodes or conductive layers of the device. On the electrode 700, the electrode layer 750 is formed as a conductive layer by densely containing an impurity having a conductivity type opposite to that of the adjacent electrode. The electrode 750 connects with the plate line 800.

With reference to FIG. 1, carriers produced by the PN junction between electrodes 750 and 700 are led to the electrode 600 after tunneling through the tunneling portion of the insulating film 900. Therefore, the potential of the memory charge storage portion or electrode 600 is written or rewritten by the charge of the carriers, or erased as explained above. Carriers led into the charge storage electrode portion 600 do not diminish or leak with time, because the electrode 600 is not electrically connected to any other conductive layer, that is the electrode 600 is enveloped or completely surrounded by an insulator for all the embodiments of the present invention.

Figure 36:
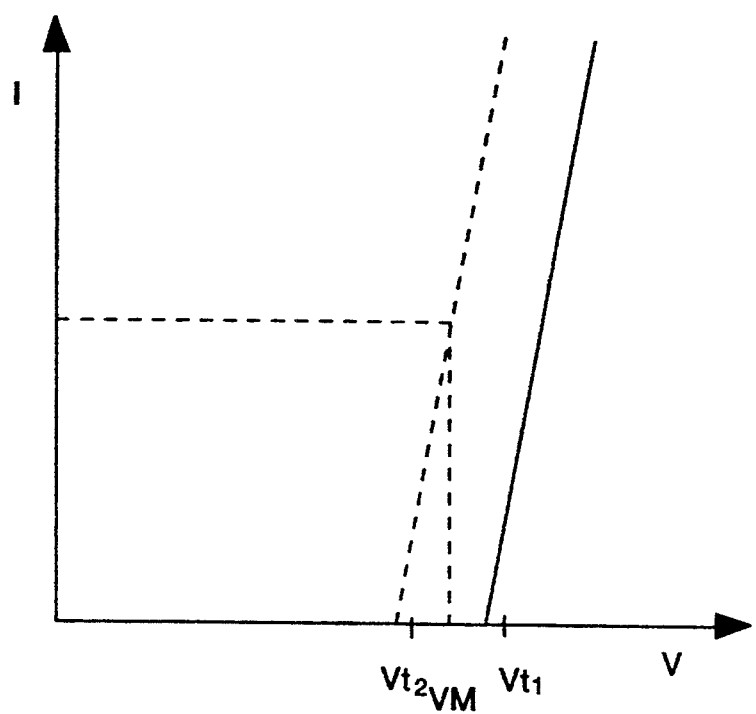
FIG. 36 is a diagram showing the characteristics of the switching transistor of the present invention according to any one of the embodiments.

Therefore, in writing data, the data to be written is sent to the memory charge storage portion 600 by applying the potential of the bit line 850 to the base electrode 700 of the write element W by the switching transistor A. The switching transistor converts the memory data into a change of the switching transistor characteristics when reading the data. For example, as shown in FIG. 36 a plot of switching current I vs. switching bias voltage V, the normal transistor characteristics as shown in the solid line are changed to or from the characteristics shown in the dotted line, by the presence of information data. For example, a charge held by the memory charge holding portion 600, effectively changes the threshold voltage $V_{t1}$ to a lower value $V_{t2}$. Therefore, as indicated above, the voltage $V_M$ (between $V_{t1}$ and $V_{t2}$) may be used for purposes of reading.

The switching transistor therefore also includes the charge storage electrode portion 600 as an element that affects its characteristics. The charge storage portion 600 is separated from the channel portion 100 of the switching transistor A by the insulating film 900, and thereby the charge storage portion 600 also gives a field effect to the channel 702 between the source and drain electrodes 700 and 701 of the switching transistor A. When the potential of the electrode 600 changes, by writing data or erasing data, the threshold voltage needed to turn on the switching transistor, that is the voltage applied to the word line 200, also changes correspondingly and therefore the current output of the switching transistor also greatly changes, as shown in FIG. 36. Therefore, data can easily be read out of the memory charge storing portion 600 with the switching transistor A.

Figure 8:
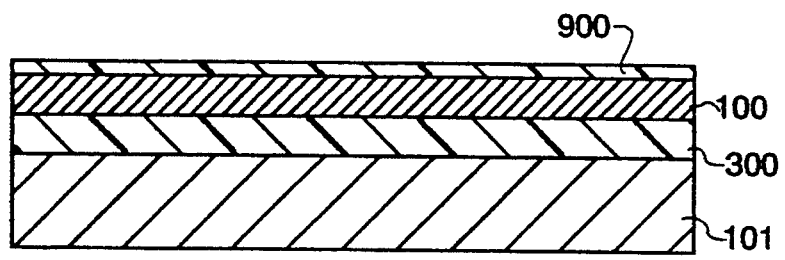
FIG. 8 is a cross sectional view showing the first stage of a manufacturing process for producing the present invention embodiment of FIG. 1.
Figure 9:
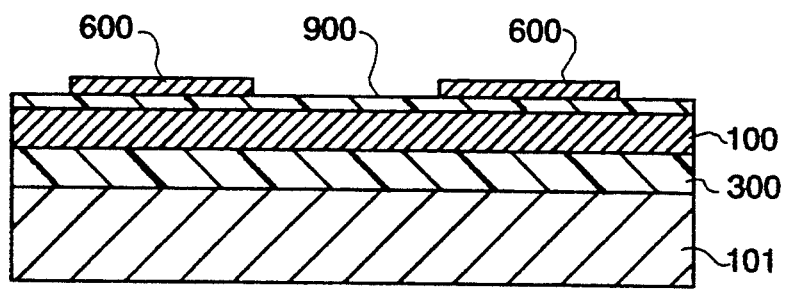
FIG. 9 is a second stage of the manufacturing process of FIG. 8.

The method forming the first embodiment of the present invention shown in FIG. 1 is described below by referring to FIGS. 8 through 19. First, as shown in FIG. 8, a thin oxide film 900 with the thickness of 30 angstrom is formed on an SOI (Silicon On Insulator) substrate, which includes a silicon dioxide film 300 and P-type single-crystalline silicon 100 on a P-type single-crystalline silicon substrate 101. As shown in FIG. 9, polycrystalline silicon made conductive by densely containing an impurity is deposited on the above substrate through chemical vapor deposition to form the electrode 600 (memory portion) through patterning by using the known photoresist method.

Figure 10:
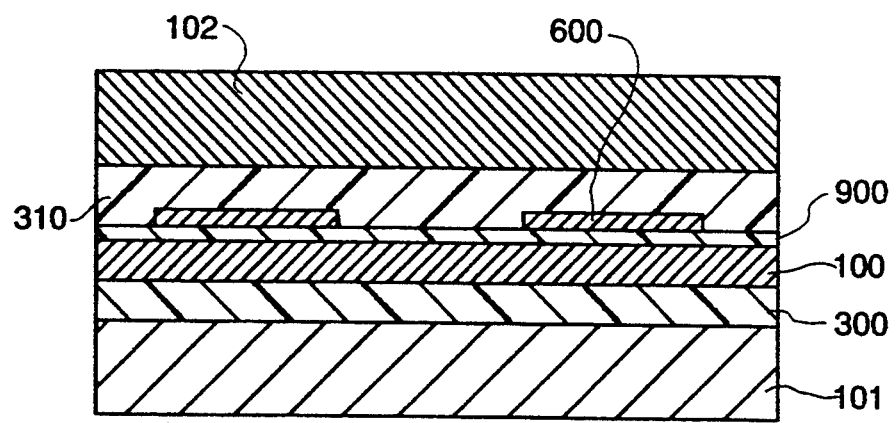
FIG. 10 is a third stage of the manufacturing process of FIG. 8.

Then, silicon dioxide 310 is deposited on the above substrate and moreover, next a silicon substrate 102 is put on the oxide 310; thereafter annealing bonds the oxide layer 310 with the silicon substrate 102 (FIG. 10).

Figure 11:
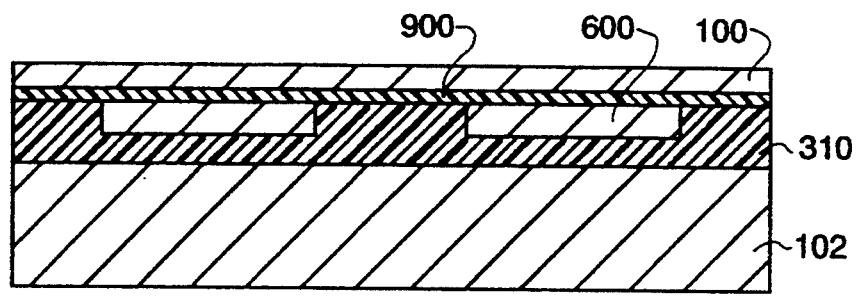
FIG. 11 is a fourth stage of the manufacturing process shown in FIG. 8.

Then in FIG. 11, the structure is inverted and the above P-type single-crystalline silicon layer 100 is exposed as a substrate surface by using the silicon substrate 102 as a new substrate and etching away the substrate 101 and the oxide film 300.

Figure 12:
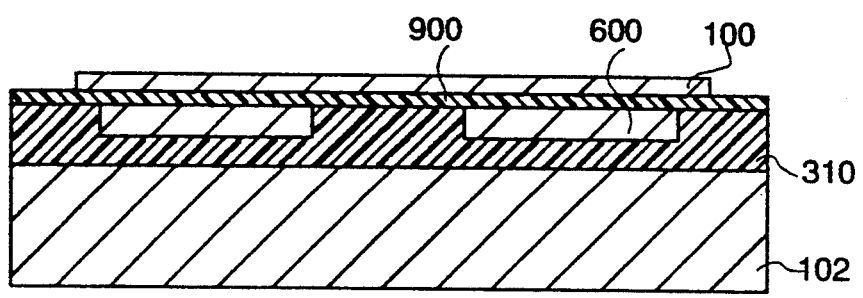
FIG. 12 is a fifth stage of the manufacturing process shown in FIG. 8.

An active region is patterned on the silicon layer 100 by etching away silicon layer 100 except for the region overlying to the bottom electrodes 600, to form an isolation region 100 as shown in FIG. 12.

Figure 13:
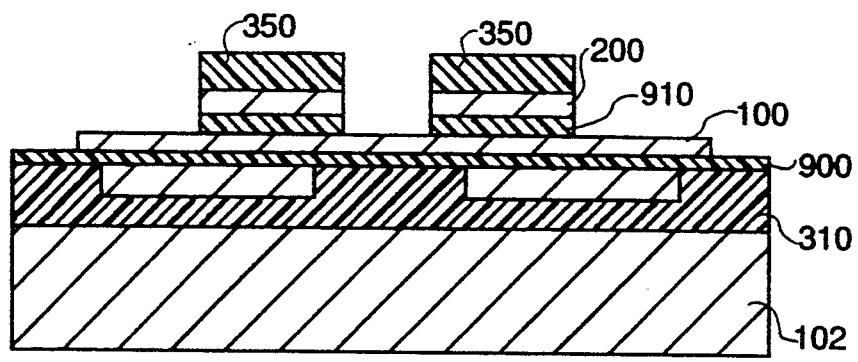
FIG. 13 is the sixth stage of the manufacturing process shown in FIG. 8.

Then, a 4-nm oxide film 910 is selectively formed on the surface of the silicon layer 100 through thermal oxidation and moreover, polycrystalline silicon at 200 made conductive by densely containing an impurity and a silicon dioxide layer 350 are deposited on the film 910 through the chemical vapor deposition method. The polycrystalline silicon at 200 and silicon dioxide layer 350 are anisotropically etched by using resist as a mask to form the word line 200 made of polycrystalline silicon as shown in FIG. 13. The above process can be executed similarly to form the gate electrode of the conventional MOSFET.

Silicon dioxide is uniformly deposited on the above substrate through the 50-nm chemical vapor deposition method and then anisotropically etched to form a silicon dioxide layer (spacer) 360 at the side of the above word line/gate 200 and silicon dioxide layer 350 respectively. The source and drain electrodes 700 and 701 are formed by applying ion implantation to the Si layer 100 with the word line/gate 200 as a mask thereby densely doping the silicon substrate 100 with arsenic, FIG. 14.

Figure 15:
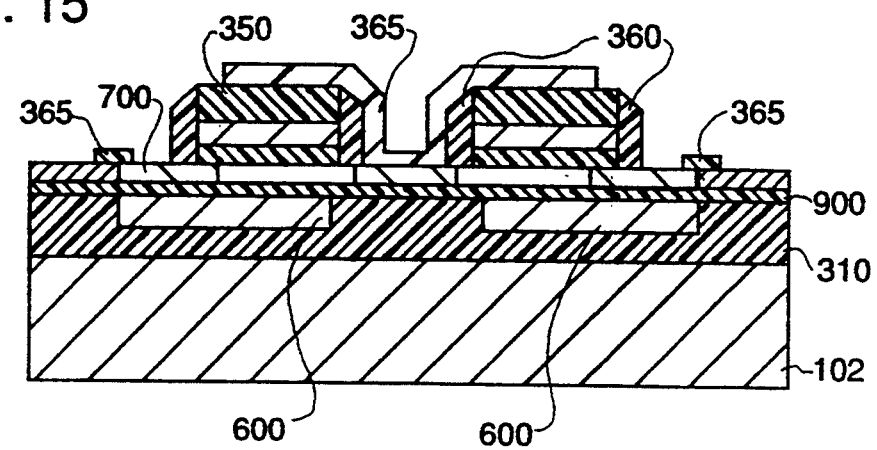
FIG. 15 is the eighth stage of the manufacturing process for the device of FIG. 1.
Figure 14:
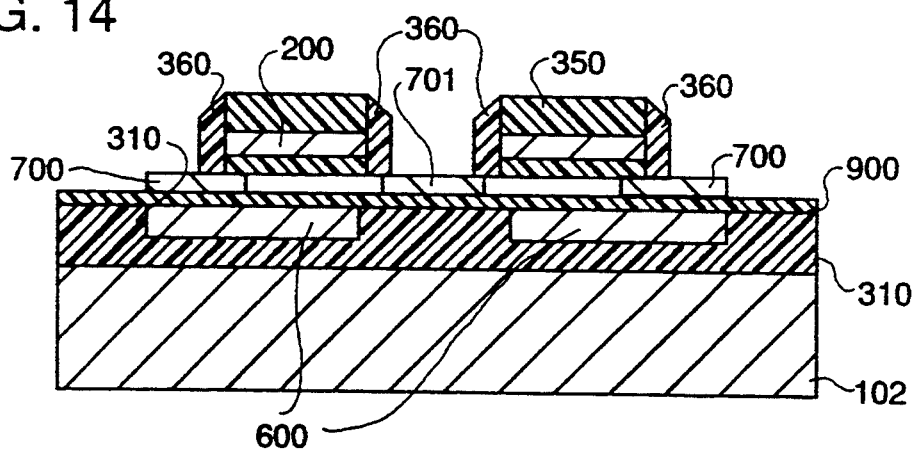
FIG. 14 is the seventh stage of the manufacturing process starting with FIG. 8.

Then, a silicon dioxide film 365 is deposited on the oxide layer 350 up to 30 nm through the chemical vapor deposition method while leaving open part of the diffusion layer electrode 700 through patterning using a photoresist as shown in FIG. 15.

Figure 16:
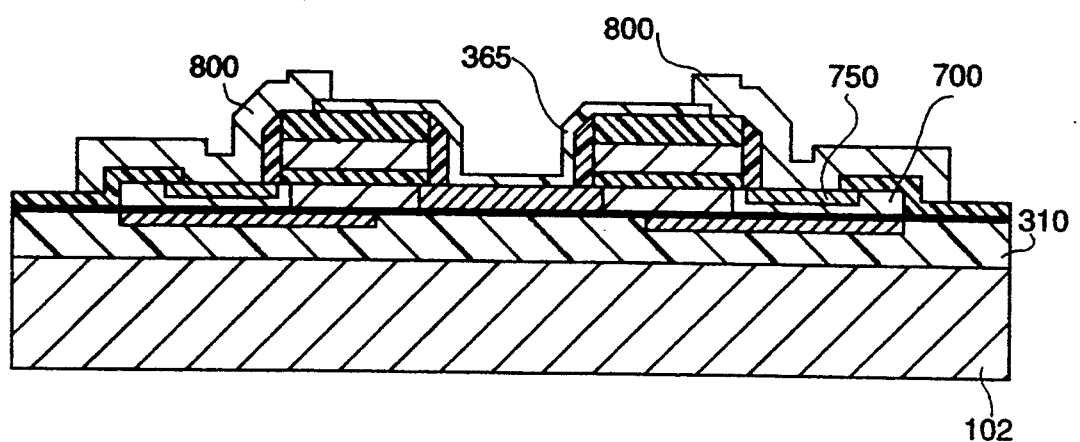
FIG. 16 is the ninth stage of the manufacturing process for the device of FIG. 1.

Polycrystalline silicon densely containing boron is deposited on 700 and adjacent parts of the film 365 up to 200 nm through the chemical vapor deposition method and fabricated by forming openings to form the plate line electrode 800 as shown in FIG. 16. In this case, the boron diffused from layer 800 into the diffusion layer electrode 700 through the opening forms the collector 750.

Figure 17:
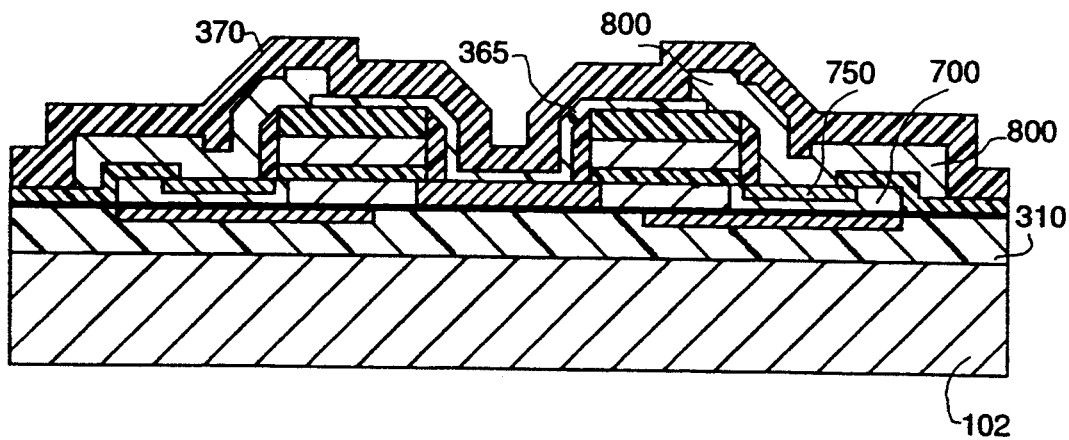
FIG. 17 is the tenth stage of the manufacturing process for the device of FIG. 1.

As shown in FIG. 17, a silicon dioxide film is formed evenly on top of the entire substrate.

Figure 18:
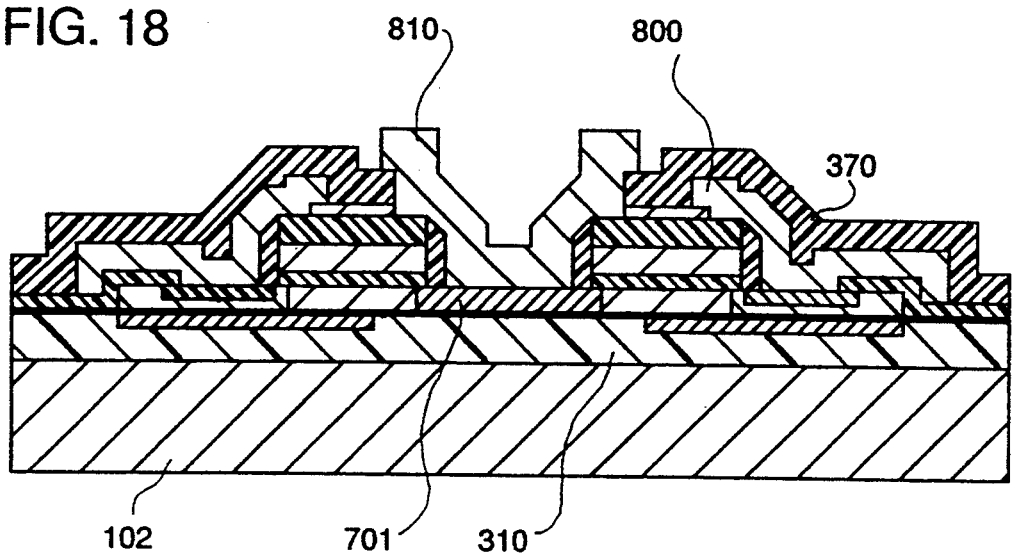
FIG. 18 is the eleventh stage of the manufacturing process for the device of FIG. 1.

Next, the silicon dioxide layer 370, and film 365 are patterned to remove the central portion by etching between the work lines 200, to open the electrode layer 701. Then the bit-line connecting layer 810 is formed on the above substrate by depositing, through the chemical vapor deposition method as seen in FIG. 18, polycrystalline silicon densely containing phosphorus, and then executing fabrication.

Figure 19:
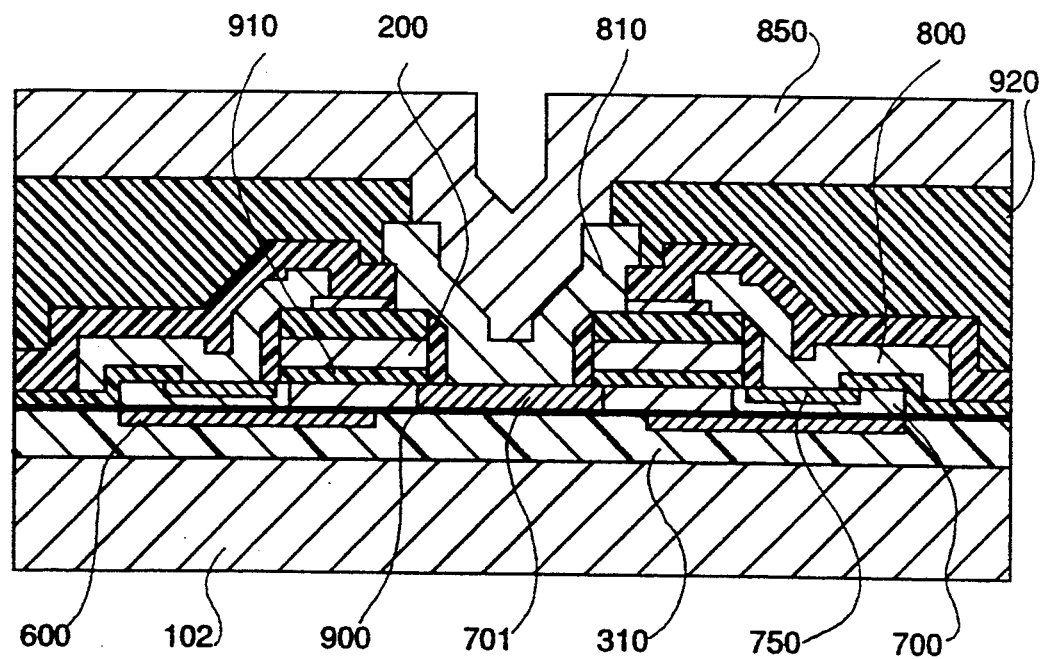
FIG. 19 shows the final stage of the manufacturing process for the device of FIG. 1.
Figure 20:
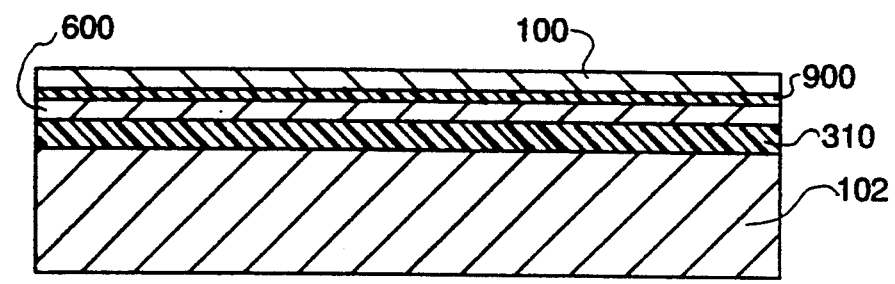
FIG. 20 shows a first stage of the manufacturing process for a second embodiment of the present invention.

The first embodiment of the semiconductor memory device shown in FIG. 1 can be obtained by depositing a passivation insulator 920 and using the known metalization process of integrated semiconductor device making for opening a contact hole on the above bit-line connecting layer 810 or the like and forming the line 850 with a metallic material as shown in FIG. 19.

For the above semiconductor memory device, it is possible to write the same data in memory cells connected to the same plate line at the same time. Therefore, it is possible to constitute the device so that it executes a write operation in arrays by separately fabricating the plate line for each memory cell.

Figure 21:
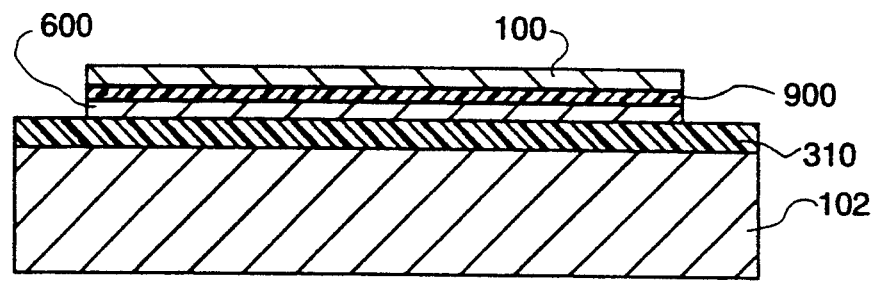
FIG. 21 shows a second stage of the manufacturing process of the second embodiment.

For the above first embodiment, the memory portion 600 is previously formed. However, it is possible to self-align the patterning by forming the memory portion 600 simultaneously with the silicon layer 100 as shown by the second embodiment in FIGS. 20 through 24. A substrate is obtained by uniformly depositing the polycrystalline silicon layer 600 without fabricating it, similarly to the procedure for the first embodiment in FIGS. 8 through 11. When the silicon layer 100 is fabricated, the oxide film 900 and polycrystalline silicon 600 are continuously etched as shown in FIG. 21.

Figure 22:
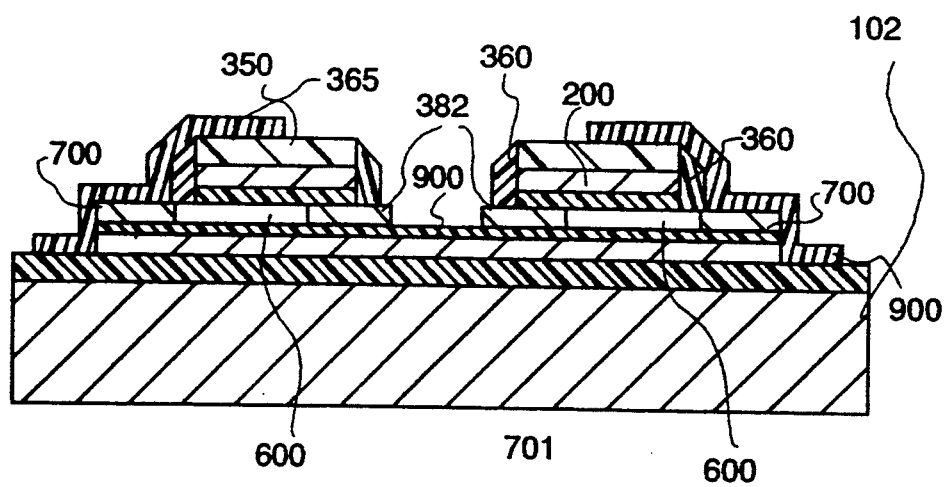
FIG. 22 shows a third stage of the manufacturing process of the second embodiment.

Then, as shown in FIG. 22, the word line 200 and silicon dioxide layer 350 are formed similarly to the case of the first embodiment, and the silicon dioxide layer (spacer) 360 is provided at the side of the word lines 200 before depositing the silicon dioxide film 365 to leave open only the middle portion between the word lines 200. In this case, the silicon 100 is simultaneously fabricated into base 700 and electrode 600 on the oxide film 900 and moreover, a silicon nitride film 382 is formed at the side of the silicon 100 through thermal nitridation.

Figure 23:
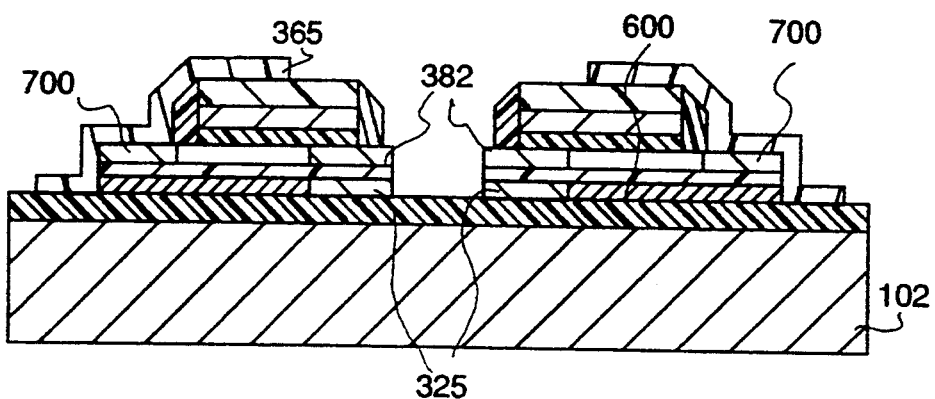
FIG. 23 shows a fourth stage of the manufacturing process of the second embodiment.

It is possible to fabricate the memory portion 600 on the active silicon layer 100 and word line 200 in self-alignment as shown in FIG. 23 by anisotropically etching the silicon dioxide film 900 on the surface of the above substrate to expose the polycrystalline silicon 600 and also anisotropically etching the silicon 600 with a mask.

Figure 24:
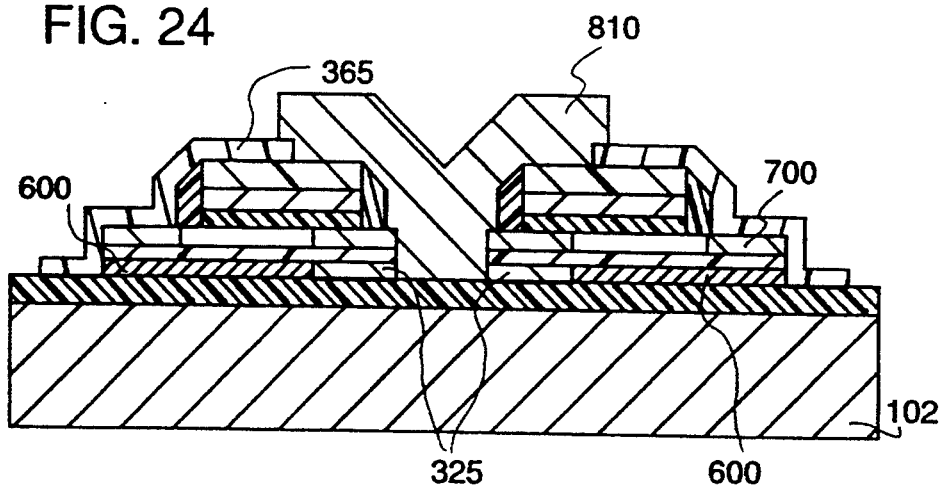
FIG. 24 shows a fifth or final stage of the manufacturing process for the second embodiment.

Then, the above substrate is oxidized to grow a silicon dioxide film 325 at the side of the memory portion 600 as shown in FIGS. 23 and 24. A write down element or the like can be formed by etching the above nitride film 382 before forming the bit-line connecting layer 810 similarly to the case of the first embodiment.

Figure 27:
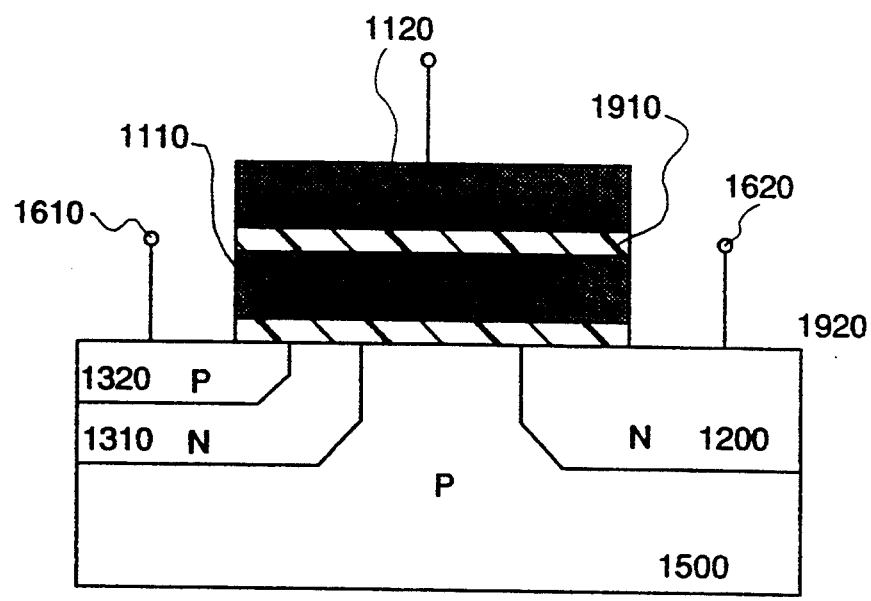
FIG. 27 is a schematic cross sectional view of a third embodiment of the present invention.

A third embodiment of the present invention is shown in FIG. 27.

For the write operation for the third embodiment of FIG. 27, the control electrode 1120 is biased with a positive voltage, an N-type channel is formed at a P-type substrate surface of substrate 1500 between the N-type source/drain layer 1200 and the N-type drain/source layer 1310. If the first electrode 1610 is biased negative with respect to the second electrode 1620, the electrons which are generated due to the breakdown at the PN junction of the P-type layer 1320 and the N-type layer 1310 will be injected into the floating gate 1110. Thus, the threshold voltage $V_{TH}$ of the MOS switching transistor is thereby increased to become $V_H$. If the control electrode 1120 is biased to a negative voltage and an appropriate bias voltage is applied between the first electrode 1610 and the second electrode 1620, holes which are generated from either the PN-type layer 1320 or the P-type substrate 1500 will be injected into the floating gate 1110. Thus, the threshold voltage $V_{TH}$ of the MOS switching transistor at this time will be decreased to $V_L$. As described with respect to the first embodiment, the memory charge storage portion (here the floating gate electrode 1110) may thereby be written with data or erased.

In the read cycle for the third embodiment of FIG. 27, a voltage $V_M$, that is a medium voltage between $V_H$ and $V_L$ is applied to the control electrode 1120. No current flows between the first electrode 1610 and the second electrode 1620 when the memory cell is in a condition with a high threshold voltage $V_H$. On the other hand, if any current flows therebetween, this indicates that the memory cell is in a condition of a low threshold voltage $V_L$. Thereby, it can be determined whether the memory cell has $V_H$ or $V_L$, that is the data can be read.

Figure 29:
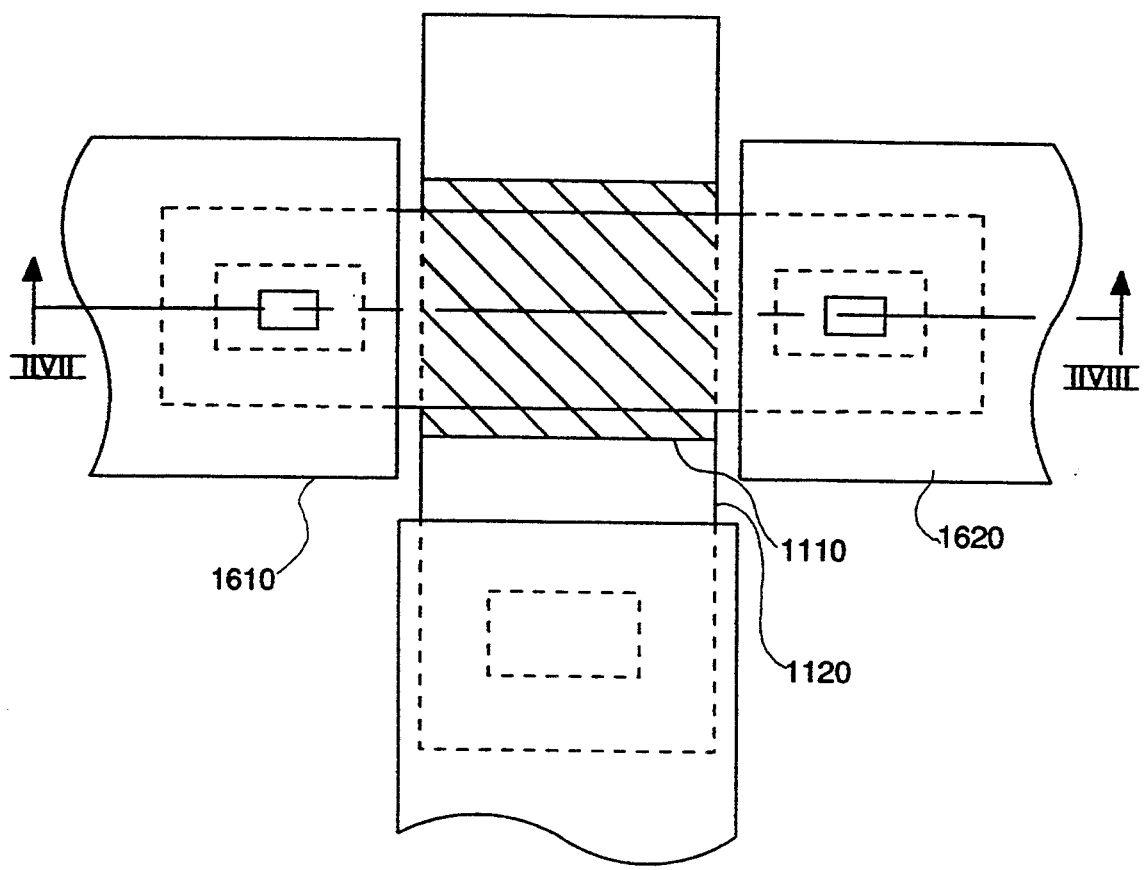
FIG. 29 is a plan view of the memory cell of FIG. 28.
Figure 28:
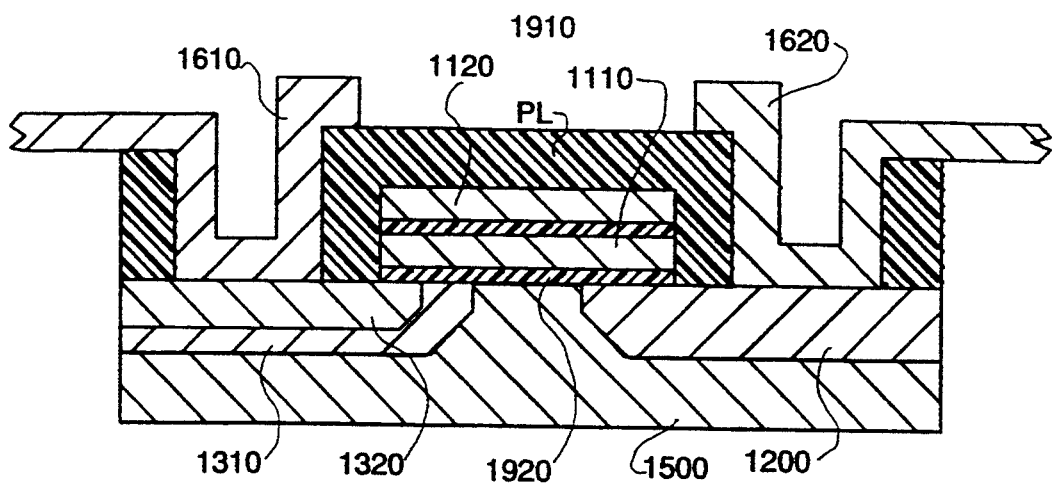
FIG. 28 is a cross sectional view taken on line IIVII--IIVIII of FIG. 29 of the third embodiment of the present invention shown in FIG. 27.

In the first embodiment, the memory charge storage portion is constructed at the backside of the switching transistor channel, whereas in the third embodiment, the memory charge storing portion 1110 is constructed at the surface side of the channel. An actual cross sectional view of the third embodiment is shown in FIG. 28, whereas a plan view of the same is shown in FIG. 29. The diffusion layer electrode 1320 has a different conductivity type than the diffusion layer electrode 1310, and each are fabricated on the opposite side of the tunneling insulation film 1920 from the floating gate electrode 1110. The outer layer 1310 has $3 \times 10^{18}$ cm$^{-3}$ impurities that have the opposite conductivity type of the substrate 1500. The inner layer 1320 comprises $5 \times 10^{20}$ cm$^{-3}$ impurities that have the same conductivity type as the substrate 1500. The other diffusion layer electrode 1200 has $5 \times 10^{20}$ cm$^{-3}$ impurities of a conductivity type different from the substrate 1500. Substrate 1500 has $2 \times 10^{17}$ cm$^{-3}$ impurities. The double diffused electrode layers 1310, 1320 work as the write down element in the same manner as in the preceding embodiments.

The following operation is based on the assumption of a p-type substrate. During the write cycle, there is a positive word line bias to make the channel between the electrodes 1200 and 1310, and a reverse bias is applied to the PN junction of 1310/1320. Because of this reverse bias, carriers are generated and injected into the floating gate 1110. To decrease the number of electrons in the floating gate 1110, a negative bias is applied to the word line 1120 and the surface of outer layers 1320 has conductivity. The channel current between electrodes 1310 and 1200 generates holes as carriers. The generated hole carriers are injected into the floating gate 1110 by tunneling through the tunneling insulator 1920. Further, the inner layer 1320 acts as an absorber that absorbs the opposite polarity carriers, electrons, from the floating gate 1110. This operation can be applied for the first embodiment, instead of the operation which is described with respect to FIG. 7. In this case, the PN junction of 700/750 is biased reversely. In the read condition, by setting a forward bias between MOS electrodes 1320 and 1200, a forward bias is applied to the PN junction 1310/1320 when the channel between MOS electrodes 1310 and 1200 in the "ON" state, so that the stored data is read by the current flowing between MOS electrodes 1320 and 1200, as previously described. In FIG. 28, the passivation layer PL is a part of the insulation that completely isolates or envelops the charge storage portion 1110.

Figure 30:
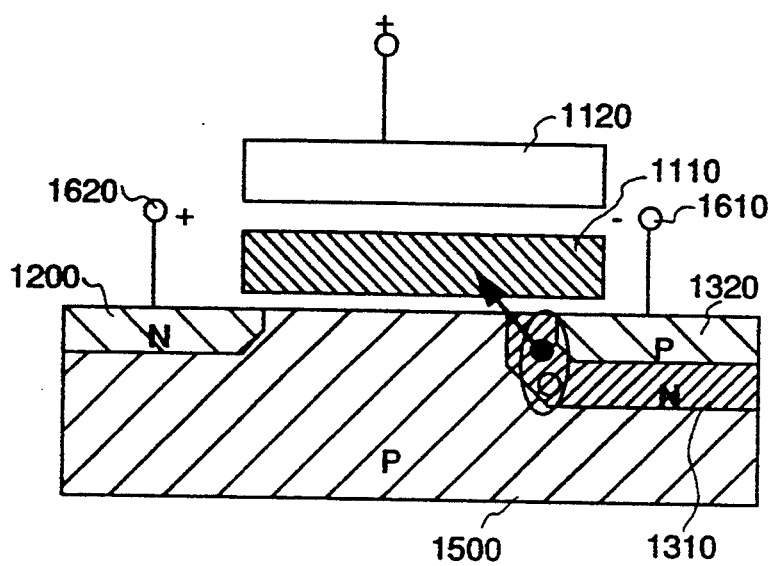
FIG. 30 is a schematic diagram illustrating the write cycle for the third embodiment of FIG. 27.
Figure 31:
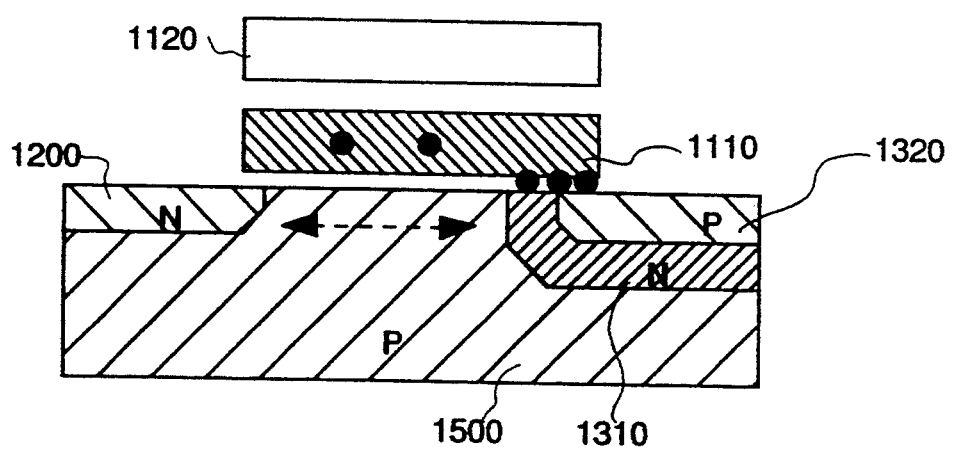
FIG. 31 is a schematic illustration of the read cycle for the third embodiment of FIG. 27.

The write operation wherein electrons are injected into the memory charge storage portion 1110 is shown in FIG. 30, with the positive voltage applied to the gate electrode 1120 and the electrode 1620, and with a relative negative voltage applied to the electrode 1610. During the above described read operation of the third embodiment, it is seen that part of the electron carriers are trapped in the insulator 1920 as indicated in FIG. 31, while others of the electrons (solid black dots) are held in the memory charge storage portion 1110. During the read cycle of FIG. 31, it is seen that the electrons held in the floating gate memory charge storage portion 1110 will be opposite the channel (area extending between the oppositely facing arrows) and affect the threshold voltage (transistor characteristics) to provide for the above described read operation, without substantial interference by the carriers that are trapped in the vicinity indicated directly between electrodes 1310, 1320 and the charge storage portion 1110.

Figure 32:
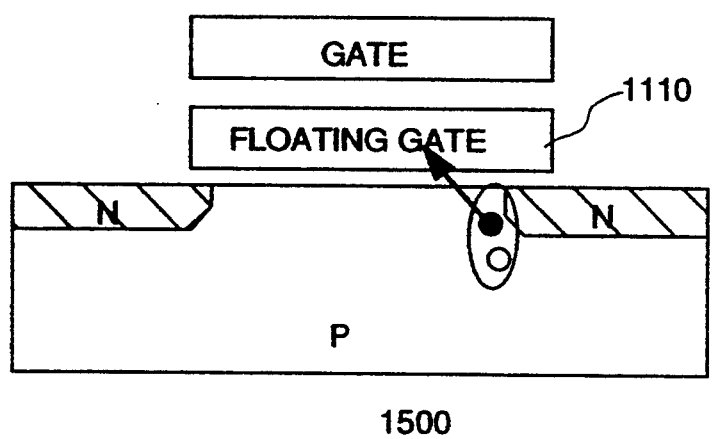
FIG. 32 is a schematic representation of the write cycle of the conventional DRAM shown in FIG. 2, as analyzed by the present invention.
Figure 33:
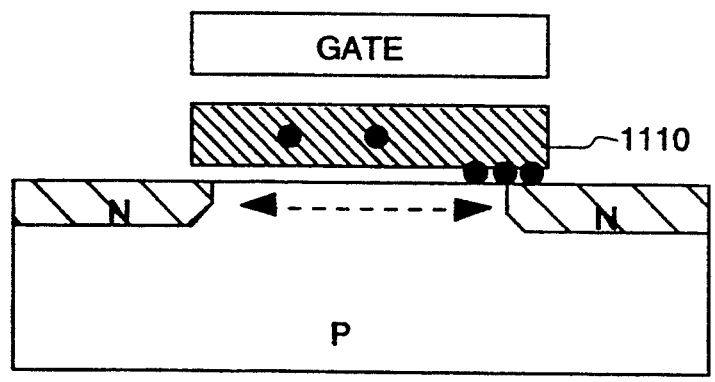
FIG. 33 is a schematic representation of the conventional read cycle for the conventional DRAM of FIG. 2, as analyzed by the present invention.

In addition to FIGS. 30 and 31 that represent the write and read functions of the third embodiment of the present invention, the inventors analysis of the write and read operations of a conventional floating gate EPROM are shown respectively in FIGS. 32 and 33. In FIG. 32, it is seen that the write operation will move the electron carriers into the floating gate by tunneling through the tunneling insulation, which according to FIG. 33 will trap electrons in the tunneling insulation. Unlike the third embodiment of the present invention, the trapped electrons will be between the gate and the channel (represented as the area between the arrows facing the opposite direction) and thus the trapped electrons will greatly influence the read characteristics of the switching transistor. Ideally, there are no trapped carriers in the insulation, but in practical applications of the EPROM and the third embodiment of the present invention, trapped electrons will appear in the separating insulation. It is seen that with the third embodiment of the present invention, such trapped electrons will have less of an affect upon the read operation than they will have in a floating gate EPROM. Furthermore, the third embodiment of the present invention has the substantial advantage of a PN junction for accelerating the electrons for tunneling into the charge storage portion 1110, and therefore the tunneling insulation may be thicker or more effective than in the device of FIGS. 32 and 33. Tunneling electrons will to some extent damage the tunneling insulation, so that it is seen that the device of FIGS. 30, 31, the third embodiment, has a substantial advantage in being able to employ a thicker or more effective tunneling insulation due to the presence of the PN junction as a part of the write element.

Due to the lack of a PN junction in the EPROM of FIGS. 32 and 33, a high voltage is needed for the write operation, which high voltage will deteriorate the tunneling insulation. In contrast, a high voltage is not needed for the write operation of the device of FIGS. 30, 31, so that such degradation of tunneling insulation does not occur or to a lesser extent. Accordingly, the life of the third embodiment according to FIGS. 30 and 31 is greatly improved over that of the EPROM of FIGS. 32, 33, according to the inventors analysis.

Figure 34:
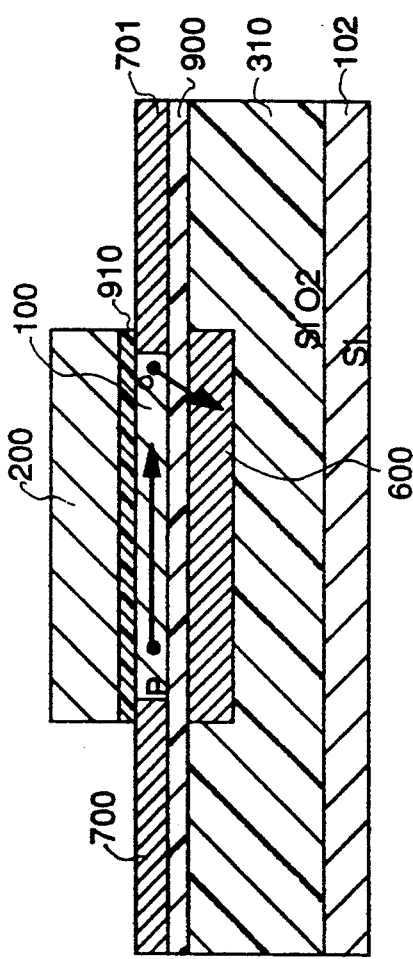
FIG. 34 is a schematic cross sectional view of a fourth embodiment of the present invention showing the write cycle.

FIG. 34 shows a modification of the first embodiment of the present invention, wherein the PN junction for the write element has been eliminated.

In FIG. 34, the substrate 102 is preferably silicon, and the layer 310 is preferably silicon dioxide, as a part of the insulation enveloping the memory charge storage portion 600. Layer 900 is an insulator, as previously described, and N-type electrodes 700, 701 function as the source and drain, with respect to the channel portion 100. The switching transistor gate 200 is separated from the channel by the gate insulation 910. Like the write operation of the EPROM for FIG. 32, a high voltage can be applied to tunnel electrons (tunnel holes for the erase, or vice versa) through the tunneling insulation 900 to thereby change the charge on the memory charge storage portion 600. It is seen therefore that the gate 200 and charge storage portion 600 are on opposite sides of the tunneling insulation. The read operation is basically the same as that previously described with respect to the other embodiments. For example, for a write operation, the drain and source may be negative and the gate positive with respect to the neutral charge of the charge storage portion 600. Whereas for erasing, the gate may be a high positive voltage with respect to a lower positive voltage for the drain and the source, which source may be of equal voltage to the drain or a neutral voltage equal to that of the neutral charge condition of the charge storage portion 600 or actually a negative voltage. During the read cycle, which is the same as the first embodiment, a slight source drain bias can be used for such reading and such bias is small enough to prevent injection of any carriers through the tunneling insulation to the charge storage portion 600, so that the read operation is non-destructive. That is, there is very little channel current during the read operation.

Figure 35:
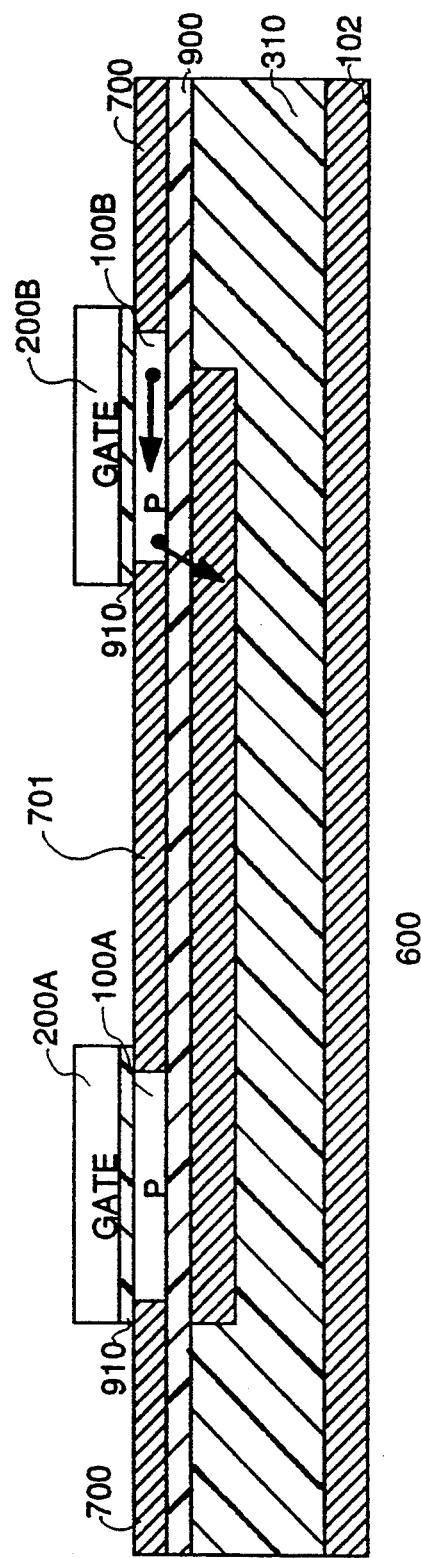
FIG. 35 is a schematic representation of the fifth embodiment of the present invention schematically showing the write cycle.

The last embodiment shown in FIG. 35, separates the channel, and therefore the read cycle is not so sensitive to injecting carriers and the read cycle may tolerate a greater channel current without injecting carriers into the charge storage portion 600.

In general, the writing cycle takes higher energy than the read cycle, and the erase cycle is of opposite polarity than the write cycle. The write and erase cycles employ high voltage, whereas the read cycle employs medium voltage, as previously described. In general, the gate to drain voltage may be the same for the write, erase and read cycles, to provide for the channel current.

The final embodiment shown in FIG. 35, differs from the embodiment of FIG. 34 only in separating the gate and separating the channel, with the gate of FIG. 34 being separated into gates 200A and 200B of FIG. 35, while the channel 100 of FIG. 34 is separated into channel 100A and channel 100B in FIG. 35. In FIG. 35, the gate 200B and channel 100B (P-type) are used for write, while the gate 200A and channel 100A (P-type) are used for read. The drain source layers 700, 701 are of N-type conductivity. The structure of FIG. 35 has the advantage over the structure of FIG. 34 in that carriers trapped in the insulation layer 900 during the write cycle will not affect the read cycle, because they are far removed from the read channel. Thus, there are separate read and write channels. For ease of fabrication, the insulation layer 900 is only a single layer of a single uniform thickness, but there is contemplated the situation where the thickness of the insulating film 900 may be different for the tunneling portion beneath the channel 100A and the insulation portion beneath the write channel 100B. There is the further advantage of the separation provided by FIG. 35 in that damage to the tunneling insulation will not affect the switching transistor characteristics during the read cycle. During the read cycle, the drain and source for the write portion may be held at the same potential as the gate 200B. Conversely, during the write cycle, the drain and source portions of the read side may be held to the same potential as the read gate 200A.

As mentioned previously, each of the memory cell embodiments may be placed in the matrix of FIG. 25. Further, unless otherwise mentioned, similar structures, functions and advantages apply to all of the embodiments.

In all of the embodiments, there is no need for a refresh cycle, but in practical embodiments a refresh cycle may be provided infrequently, but in general the memory may be considered nonvolatile or static. The function of the plate line is for setting the voltages $V_H$, $V_L$ and $V_M$, as explained above.

While some of the embodiments employ a PN junction for accelerating the carriers during the write operation and others do not, the PN junction is preferred for the reasons mentioned herein. The charge storage portion 600 (1110 etc.) can be metal, undoped silicon, doped silicon, silicide, or any conductor in general. The layer 700, although disclosed as being doped can be intrinsic so that there is no PN junction. Also, the PN junction may be a junction between silicon and GeSi, wherein the silicon is doped to be of P-type and the GeSi is intrinsic.

As described above, the semiconductor memory device of the present invention comprising a switching transistor consisting of an insulated gate field effect transistor formed on a semiconductor substrate and a memory portion for storing data by charges of carriers makes it possible to cover the electrode of the memory portion with an insulator and prevent charges from leaking because the switching transistor and write down element are formed by enclosing the memory portion with the insulator and having a write down element of a substrate contacting the insulator for changing the charge amount of the memory portion and an electrode having a PN junction with different conductivity types.

While a preferred embodiment has been set forth along with modifications and variations to show specific advantageous details of the present invention, further embodiments, modifications and variations are contemplated within the broader aspects of the present invention, all as set forth by the spirit and scope of the following claims.

We claim:

1. A memory, comprising:
    a plurality of word lines, a plurality of bit lines, a plurality of plate lines, and a plurality of memory cells, all arranged in a matrix;
    a word line driver for establishing a voltage on one or more word lines;
    a plate line driver for establishing a voltage of one or more plate lines;
    a sense circuit connected to said bit lines;
    a write circuit connected to said bit lines;
    each of said memory cells being substantially identical and having a switching FET with a gate connected to a word line and one of a source and drain connected to a bit line, a memory charge storage electrode, insulation completely surrounding the memory charge storage electrode to envelop it, and the memory charge storage portion being sufficiently adjacent a channel of the switching FET so that a charge held by the memory charge storage portion will change the characteristics and particularly the threshold voltage of the switching FET; and
    said write circuit including a write element connected between a plate line and a word line for each of the memory cells for tunneling charges through the insulation into the memory charge storage portion during a write cycle.

2. The memory of claim 1, wherein said write element includes PN junction means for accelerating charge carriers into the memory charge storage portion during the write cycle.

3. The memory device of claim 2, wherein said write element is a bipolar transistor.

4. The memory device of claim 3, wherein the bipolar transistor has a base connected to the other of the drain and source of the switching FET, the memory charge storage portion is one of an emitter and collector of the bipolar transistor, and the other of the emitter and collector of the bipolar transistor is connected to the plate line.

5. The memory of claim 2, wherein the PN junction has a P electrode and an N electrode, with one of the P and N electrodes only being in common with one of the source and drain of the FET.

6. A memory, comprising:
    a plurality of word lines, a plurality of bit lines, a plurality of plate lines, and a plurality of memory cells, all arranged in a matrix;
    a word line driver for establishing a voltage on one or more word lines;
    a plate line driver for establishing a voltage of one or more plate lines;
    a sense circuit connected to said bit lines;
    a write circuit connected to said bit lines;
    each of said memory cells being substantially identical and having a switching FET with a gate connected to a word line and one of a source and drain connected to a bit line, a memory charge storage electrode, insulation completely surrounding the memory charge storage electrode to envelop it, and the memory charge storage portion being sufficiently adjacent a channel of the switching FET so that a charge held by the memory charge storage portion will change the characteristics and particularly the threshold voltage of the switching FET; and
    each of said memory cells including a write element being an FET separate from the switching FET.

7. The memory device of claim 6, wherein the write element FET and the switching FET have their channels separate and spaced from each other, and the memory charge storage portion is a single conductor extending beneath each of the switching FET channel and the write element FET channel.

8. A memory, comprising:
    a plurality of word lines, a plurality of bit lines, a plurality of plate lines, and a plurality of memory cells, all arranged in a matrix;

a word line driver for establishing a voltage on one or more word lines;

a plate line driver for establishing a voltage of one or more plate lines;

a sense circuit coupled to said bit lines;

a write circuit coupled to said bit lines;

each of said memory cells being substantially identical and having a switching FET with a gate coupled to a word line and one of a source and drain coupled to a bit line, a memory charge storage electrode, insulation completely surrounding the memory charge storage electrode to envelop it, and the memory charge storage portion being sufficiently adjacent a channel of the switching FET so that a charge held by the memory charge storage portion will change the characteristics and particularly the threshold voltage of the switching FET; and each of said plurality of memory cells including a write element coupled between a plate line and the other of a source and a drain of said switching FET for tunneling charges through the insulation into the memory charge storage portion during a write cycle.

9. The memory of claim 8, wherein said write element includes PN junction means for accelerating charge carriers into the memory charge storage portion during the write cycle.

10. The memory device of claim 9, wherein said write element is a bipolar transistor.

11. The memory device of claim 10, wherein the bipolar transistor has a base coupled to the other of the drain and source of the switching FET, the memory charge storage portion is one of an emitter and collector of the bipolar transistor, and the other of the emitter and collector of the bipolar transistor is coupled to the plate line.

12. The memory of claim 9, wherein the PN junction has a P electrode and an N electrode, with one of the P and N electrodes only being in common with one of the source and drain of the FET.

13. The memory of claim 8, wherein said write element is an FET separate from the switching FET.

14. The memory device of claim 13, wherein the write element FET and the switching FET have their channels separate and spaced from each other, and the memory charge storage portion is a single conductor extending beneath each of the switching FET channel and the write element FET channel.

* * * * *